United States Patent [19]

Raimond

[11] Patent Number: 5,569,056
[45] Date of Patent: Oct. 29, 1996

[54] ELECTRICAL CONNECTION DEVICE AND PROCESS FOR THE PRODUCTION THEREOF

[75] Inventor: Gérard Raimond, Montrouge, France

[73] Assignee: Proner Comatel, Noisy-Le-Grand, France

[21] Appl. No.: 503,260

[22] Filed: Jul. 17, 1995

Related U.S. Application Data

[63] Continuation of Ser. No. 243,139, May 16, 1994, abandoned.

[30] Foreign Application Priority Data

May 14, 1993 [FR] France ........................ 9305818

[51] Int. Cl.$^6$ ........................................ H01R 4/02
[52] U.S. Cl. ........................................ 439/876; 439/83
[58] Field of Search ........................ 439/83, 876, 886

[56] References Cited

U.S. PATENT DOCUMENTS

| | | | |
|---|---|---|---|
| 4,900,279 | 2/1990 | Dennis | 439/876 |
| 5,015,206 | 5/1991 | Dennis | 439/876 |
| 5,090,926 | 2/1992 | Seidler | 439/876 |
| 5,236,789 | 8/1993 | Cowie et al. | 439/886 |
| 5,281,176 | 1/1994 | Yahagi et al. | 439/886 |
| 5,316,507 | 5/1994 | Capp | 439/886 |

FOREIGN PATENT DOCUMENTS

| | | |
|---|---|---|
| 0307766 | 3/1989 | European Pat. Off. . |
| 0394588 | 10/1990 | European Pat. Off. . |
| 2302006 | 9/1976 | France . |

*Primary Examiner*—Gary F. Paumen
*Attorney, Agent, or Firm*—Young & Thompson

[57] ABSTRACT

An electrical connection device of the type comprising a folded configuration of resilient material adapted to ensure elastic retention and a coating of malleable material to be soldered or brazed adapted to be melted to ensure electrical connection. The coating of malleable material (3) is substantially recessed within said resilient material (1), by being disposed in a groove (3) provided within said resilient material (1). The groove (2) has an inner surface and two flared edges (2b,2c). At least one of the edges (2b2c) of the groove (2) is outside the resilient bearing plane (P), such that the malleable material (3) will be separated from the bearing plane (P) by a predetermined distance (d). The folded configuration of resilient material and the malleable material (3) are cut out to form clips, the resilient material (1) is not to extend laterally beyond the cut-out clips (12). The non-clip portions of the device are in the form of a strip having a laddered configuration with guide positioning holes (8, 9) for an automatic insertion of electrical contacts along one side of a hybrid circuit or of a printed circuit or the like. When the malleable material (3) is melted, it flows by capillarity and solidifies to form electrical contacts (17, 19) that do not extend substantially beyond the clips (12).

17 Claims, 2 Drawing Sheets

ELECTRICAL CONNECTION DEVICE AND PROCESS FOR THE PRODUCTION THEREOF

This application is a continuation of application Ser. No. 08/243,139, filed May 16, 1994, now abandoned.

FIELD OF THE INVENTION

The invention relates to an electrical connection device and to a process for the production thereof.

DESCRIPTION OF RELATED ART

To connect electrical components of hydrid circuits or of multilayer electronic circuits to a principal circuit card, there is used a mounting according to which there is implanted at regular intervals connection tongues or "contacts" forming connection clips and then the portions forming connection clips of these connection tongues are soldered or brazed to the mentioned components or circuits.

Such contacts, also called "lead frames" by English-speaking specialists, are generally present in the form of strips rolled on reels of large diameter, adapted to be used on automatic machines for inserting and soldering printed circuits, simultaneously on the strips or on portions of the contact strips.

For reasons of dependability and high production, the electrical connection devices comprising connecting tongues, have developed in such a way as to provide adjacent to each connection clip a predetermined quantity of the brazing or soldering material, and thus, after having engaged the connection clips with the corresponding component or circuit, it suffices to melt the predetermined quantity of brazing or soldering material, so this material will flow according to a desired pattern and establish upon cooling a final electrical connection.

U.S. Pat. No. 4,900,279 discloses a soldered or brazed contact, comprising a contact element and a contact arm connected to the element. The arm comprises a base with a central contact extending above the base and a layer of solder on the base. The layer of solder comprises a thin coating located at the contact forming the raised point of the arm and has a thickness which increases in a direction away from the contact, to supply a mass of solder or braze adapted to form a junction with the contact, when the arm is heated.

The contact can also be provided in the form of an elastic clip comprising two contact arms opposite each other.

U.S. Pat. No. 5,015,206 discloses a soldered or brazed contact, comprising a contact element and a first arm connected to the element. The arm has a flat base with opposite edges and a quantity of solder or braze all of a piece, comprising a thin and flat coating of solder entirely connected to the base and a pair of reservoirs of solder extending along the edges of the base and solely connected to the thin coating of solder.

These known devices give satisfaction for the usual spacings and intervals of implantation, but are not adapted for miniaturization nor reduction of the implantation interval for the following reasons:

at the moment of melting of the material to be soldered or brazed, the contact forming the resilient clip of U.S. Pat. No. 4,900,279 is susceptible to slide or to be displaced along the melted interface of the thin coating, located at the contact forming the raised point of the arm;

at the moment of melting of the material to be soldered or brazed, the elastic clip of U.S. Pat. No. 5,015,026 is adapted to move along the thin and flat coating of solder. Moreover, the reservoirs of solder should not be subjected to any vibration when they are in liquid phase, thereby to avoid the formation of undesirable short circuits.

SUMMARY OF THE INVENTION

The invention has for its object to overcome the mentioned drawbacks by providing a new connection device, maintaining a substantially constant gripping of the portion forming the clip and comprising a quantity of solder material positioned so as not to give rise to the displacement of the portion forming the clip, during melting.

The invention has for its object an electrical connection device of the type comprising a bent configuration of resilient material, adapted to ensure elastic retention and a coating of malleable material to be soldered or brazed, adapted to be melted to ensure an electrical connection, characterized in that the coating of malleable material is disposed substantially within the thickness of the resilient material, preferably by being lodged within a groove provided in the thickness of the resilient material.

According to other characteristics of the invention:

the groove has a flat bottom and two flaring edges;

at least one of the edges of the groove is outside the elastic bearing line, such that the malleable material will be separated from said bearing line by a predetermined distance;

the malleable material is folded and cut off from the resilient material, so as not to overlie laterally the elastic retention members;

the device is present in the form of a strip, having a laddered configuration with guide positioning holes for an automatic insertion of electrical contacts on one side of a hybrid circuit, a printed circuit or the like;

after automatic insertion, the malleable material is melted, flows by capillarity and solidifies to form electrical contacts that do not substantially extend beyond the resilient retention members.

The invention also has for its object a process for the production of a device according to the invention, comprising the following steps:

a) a groove is provided in a strip of resilient material;

b) said groove is entirely filled with malleable material to be brazed or soldered;

c) the strip comprising the filled groove is cut out in a shape of a ladder, provided with positioning holes;

d) simultaneous bending and punching of the coated and cut-out strip are effected, to provide resilient retention members;

e) the coated, cut-out, bent and punched strip is wound on a storage spool.

The invention finally has for its object a component, of a hybrid circuit or an electronic device, provided with a device for attachment according to the invention.

The invention will be better understood from the description which follows, given by way of nonlimiting example, with reference to the accompanying drawings, in which:

DESCRIPTION OF THE INVENTION

Figure 1:
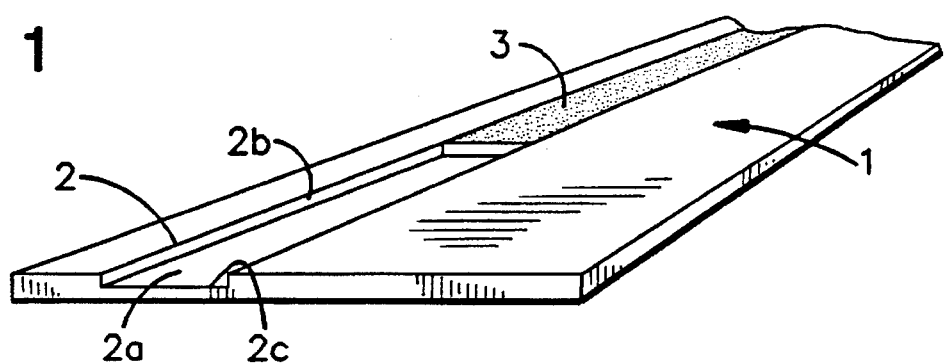
FIG. 1 shows schematically a first step in the process of production according to the invention.

With reference to FIG. 1, a strip 1 of resilient metal, such as phosphor bronze or an alloy of like electrical and resilient characteristics, is hollowed out so as to have at least one groove 2.

Groove 2 preferably has a flat bottom 2a and two upwardly flaring edges 2b, 2c: the production of the groove is effected by removal of material, for example by stripping or scraping of a continuous shaving of material or by milling by means of a milling tool of corresponding shape.

The channel delimited by the groove 2 is filled with a cold deposit of tin 3 under pressure or with heated tin, in a quantity sufficient completely to fill this channel: to this end, there is provided for example a slight over-thickness of tin relative to the plane of the strip 1. This over-thickness is preferably less than 0.05 mm, so as to ensure always a covering and a compression of the tin during the subsequent operations of forming and cutting out.

Thus, in the further production operations, the strip 1 is then bent such that the strip 1 has adjacent the channel 2 bend angles, a U-shape configuration or a polygonal configuration such that the tin or analogous ductile material will be placed in compression on the inside of an angle against the base of which it is plated by the portion forming the corresponding bending tool.

In this embodiment, the malleable and ductile brazing or soldering material is mentioned as being pure tin: of course, the invention is equally applicable to any analogous ductile material or alloy for brazing or soldering, such as an alloy of 60 percent tin and 40 percent lead, an alloy comprising silver or gold, etc . . .

Figure 2:
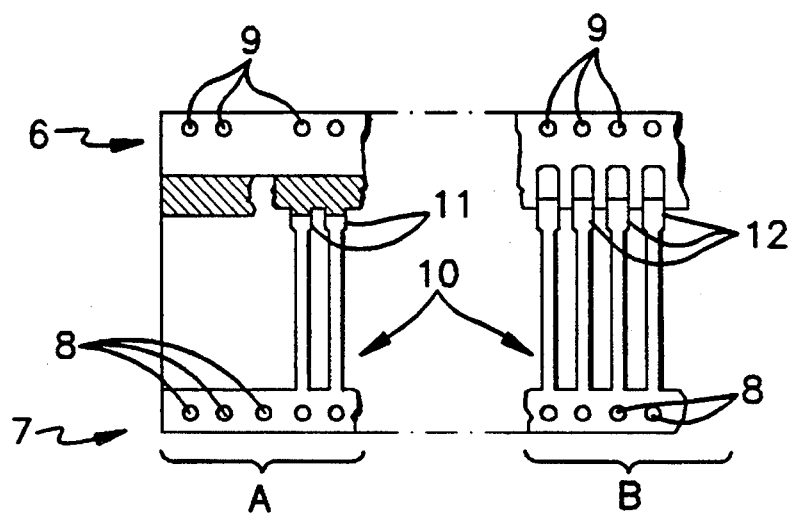
FIG. 2 shows schematically a second step of the process of production according to the invention.

Referring to FIG. 2, there is produced by cutting out and bending a coated strip of the type corresponding to FIG. 1, a strip 4 of contacts 5.

To this end, there is cut out in the course of a first step A the strip 1 so as to produce a ladder configuration whose edges 6, 7 are pierced by guide holes 8, 9 permitting the automatic insertion of hybrid circuits by a machine of known type.

The rungs 10 of this ladder configuration have an enlarged head 11 which partially coincides with the cut-out portion of the channel 2, coated with material to be brazed or soldered.

In the course of a second step B, there is simultaneously effected a bending and a punching so as to provide a clip configuration 12 within the interior of which is located the material to be soldered or brazed.

This clip configuration 12 is adapted to be inserted along the edge of a hybrid circuit, of a component adapted to be surface mounted, or the like.

Figure 3:
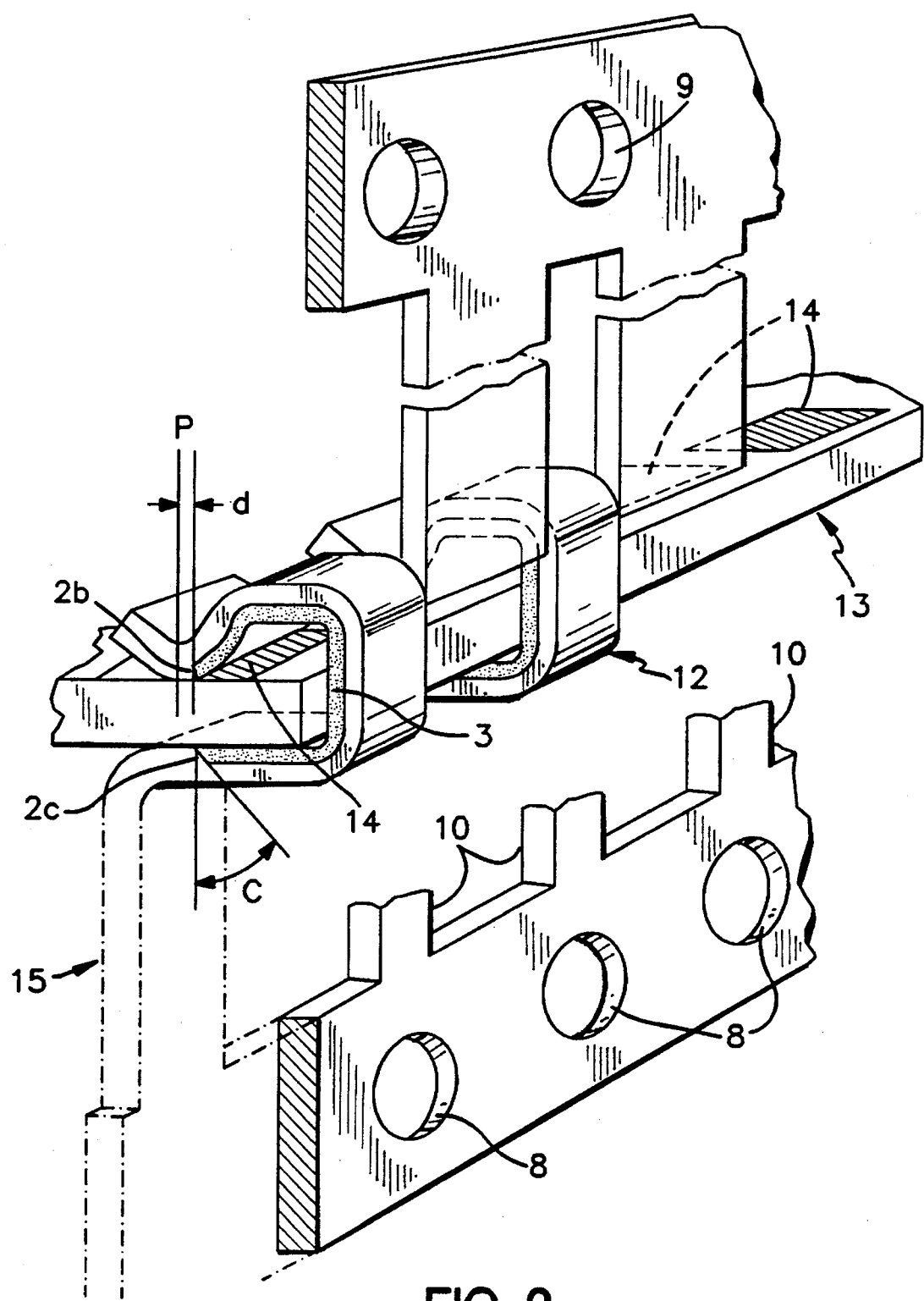
FIG. 3 shows schematically in fragmentary perspective a device according to the invention in the insertion position.

Referring to FIG. 3, a hybrid circuit 13 is shown comprising metallized connection contacts 14 and a bar 15 of contacts engaged by their clips 12 on the metallized connection contacts 14.

The clips 12 exert on the metallized contacts 14 a substantially constant grouping force corresponding to the resilient opening of the clip during insertion.

The malleable material or material 3 to be brazed is set back from the gripping plane P corresponding to the bearing line 16, a predetermined distance d: thus, during subsequent melting of the material 3, the gripping effect will not be influenced by the liquefaction of the material 3.

Moreover, the flared edges 2b, 2c, limiting the seating 2 of material 3 are inclined at an angle C comprised between 30° and 60° of arc relative to the plane P in a direction permitting avoiding any breaking or cracking during the insertion of the clips 12 on the component 13 and permitting maintaining the compression without substantial flow of the material 3 within the channel 2: this ensures the perfect filling of the channel 2 without creation of cavities or porosities arising from a lack of solder or braze material.

The material 3 to be soldered or brazed does not extend laterally beyond the clip 12, with which it has been cut off and shaped simultaneously. This arrangement avoids any undesired lateral short circuit, contrary to the lateral short circuit resulting from the presence of reservoirs of material in the devices of the prior art.

Figure 4:
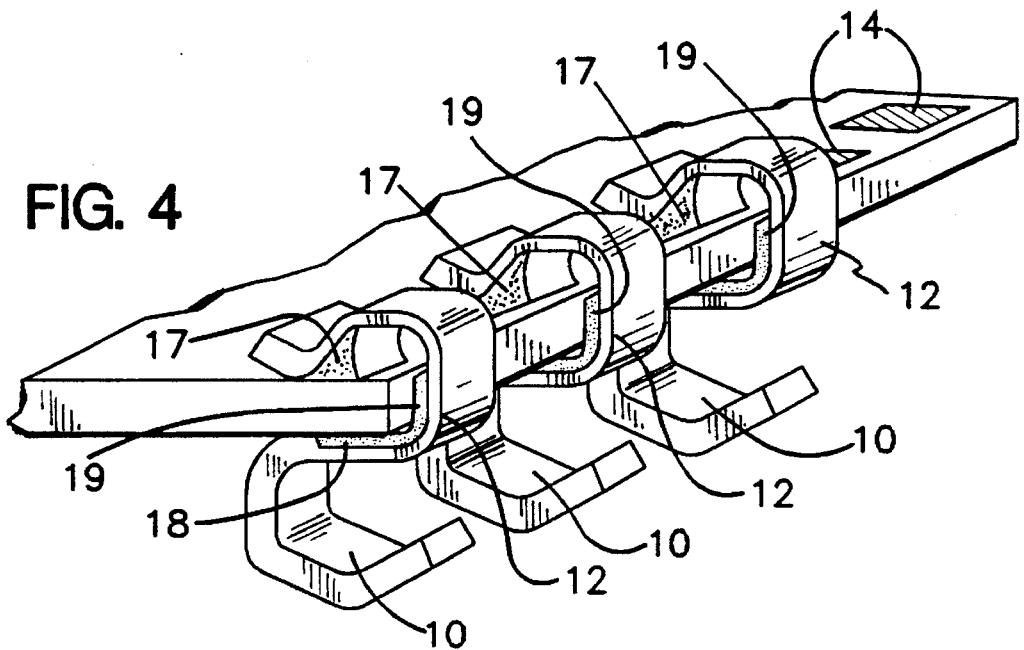
FIG. 4 shows schematically in fragmentary perspective a finished mounting according to the invention after soldering or brazing.

With reference to FIG. 4, after melting of the material 3, soldering and final cutting out of the support bends comprising openings 8 and 9 on opposite sides of the clips 12, the tongues 10 are bent to a configuration appropriate for the mounting of surface components (CMS).

The material 3 flows during melting by capillarity and solidifies in a first position, corresponding to the formation of a corner 17 forming a contact with the interior contact 14 to the clip 12; the corner 17 does not extend laterally beyond the clip 12.

The lower portion 18 of the folded internal shape of the material rests in place during melting and solidification, while the vertically-oriented material descends by capillarity and solidifies in a junction block 19 that does not extend laterally beyond the corresponding clip 12.

The invention described with reference to a particular embodiment also covers all modifications of shape and variations of production in which the malleable material to be soldered or brazed is applied in compression within a folded configuration, wherein the configuration exerts a resilient retention effect analogous to the effect of a clip and in which the mechanical bearing line does not comprise an intermediate coating of malleable material adapted to be melted to ensure the electrical connection by subsequent solidification.

What is claimed is:

1. An electrical connection device comprising an electrically conductive and, resilient material adapted to ensure elastic retention and a coating of electrically conductive malleable material adapted to be melted to ensure electrical connection between said electrical connection device and any conductive material connected therewith;

said resilient material comprises at least one region of reduced thickness, wherein said coating of malleable material substantially fills said at least one region of reduced thickness of said resilient material;

wherein said at least one region of reduced thickness is a groove comprises at least one flat bottom surface and at least two flared edges;

wherein the resilient material with the malleable material is folded and cut to form a clips portion and a non-clip portion and wherein the malleable material does not extend laterally beyond the clips portion; and said clips portion is inserted into a circuit, wherein said malleable material is melted to flow by capillarity and solidifies to form conductive connections that do not extend substantially beyond the clips portion.

2. The electrical connection device according to claim 1 wherein at least one of the edges of said groove is situated outside a resilient gripping plane of said device and a circuit to which the device is attached, such that the malleable material is separated from said gripping plane by a predetermined distance.

3. The electrical connection device according to claim 1 wherein said non-clip portion of the device is in the form of a strip having a laddered configuration with guide positioning holes for insertion of electrical components, whereby conductive connections are made.

4. An electrical connection device comprising a folded configuration of electrically conductive resilient cord, material adapted to ensure elastic retention and a coating of electrically conductive malleable material adapted to be melted to ensure electrical connection between said electrical connection device and any conductive material connected therewith;

said resilient material comprising at least one region of reduced thickness, wherein said coating of malleable material substantially fills said at least one region of reduced thickness of said resilient material;

wherein said folded configuration of resilient material and said malleable material are cut to form a clips portion and a non-clip portion and wherein said malleable material does not extend laterally beyond said clips portion; and said clips portion is inserted into a circuit, wherein said malleable material is melted to flow by capillarity and solidifies form conductive connections that do not extend substantially beyond the clips portion.

5. The electrical connection device according to claim 4, wherein said at least one region of reduced thickness is a groove comprising and intermediate surface and at least two flared edges, said groove being formed interiorly of said folded configuration.

6. The electrical connection device according to claim 5, wherein at least one of the edges of said at least one groove is situated outside a resilient gripping plane of said device and a circuit to which said device is attached, such that the malleable material is separated from said gripping plane by a predetermined distance.

7. The electrical connection device according to claim 4, wherein said non-clip portion of the device is in the form of a strip having a laddered configuration with guide positioning holes for insertion of electrical components, whereby conductive connections are made.

8. An electrical connection device comprising an electrically conductive resilient material adapted to ensure elastic retention and a coating of electrically conductive malleable material adapted to be melted to ensure electrical connection between said electrical connection device and any conductive material connected therewith;

said resilient material comprising at least one region of reduced thickness, wherein said coating of malleable material substantially fills at least one region of reduced thickness of said resilient material;

wherein said at least one region of reduced thickness is a groove having at least one bottom surface and at least two flared edges;

wherein the resilient material with the malleable material is folded and cut to form a clips portion and a non-clip portion and wherein the malleable material does not extend laterally beyond the clips portion;

wherein at least one of the edges of said groove is situated outside a resilient gripping plane of said device and a circuit to which the device is attached, such that the malleable material is separated from said gripping plane by a predetermined distance;

wherein said clips portion is inserted into a circuit, said malleable material being melted to flow by capillarity and solidify to form conductive connections that do not extend substantially beyond the clips portion.

9. The electrical connection device according to claim 8, wherein said non-clip portion of the device is in the form of a strip having a laddered configuration with guide positioning holes for insertion of electrical components, whereby conductive connections are made.

10. An electrical connection device comprising a folded configuration of resilient material able to ensure elastic retention and of malleable material able to be soldered for ensuring electrical connection upon melting and resolidifying, said malleable material forming an inlay in said resilient material, wherein said folded configuration is such that resilient material bears directly on a connection pad, wherein said malleable material is folded and cut out with said resilient material, so as not to extend laterally beyond elastic retention members (12), wherein the device is in the form of a strip having a laddered configuration with guide holes and positioning holes for an automatic insertion of electrical contacts along one side of a printed circuit, and wherein after automatic insertion, said malleable material is melted, flows by capillarity and solidifies to form electrical connections, that do not extend substantially beyond the elastic retention members.

11. A device according to claim 10, wherein said malleable material is set back from a bearing line of said resilient material on said connection pad by a predetermined distance.

12. A device according to claim 10, wherein said malleable material forming said inlay is disposed in a groove provided in a surface of the section of said resilient material.

13. A device according to claim 11, wherein said malleable material forming said inlay has two flared edges inclined each at a predetermined angle relative to a gripping plane corresponding to the elastic retention exerted by said resilient material on a connection pad.

14. A device according to claim 13, wherein each said angle is comprised between 30 and 60 degrees.

15. A device according to claim 10, wherein, upon bending, said resilient material in said folded configuration exerts a compression on said malleable material.

16. A device according to claim 12, wherein said groove has two flared edges.

17. A device according to claim 12, wherein at least one of the edges of the groove is outside the bearing line, such that malleable material is separated from said bearing line by a predetermined distance.

* * * * *